United States Patent
Cho et al.

(10) Patent No.: US 6,972,222 B2
(45) Date of Patent: Dec. 6, 2005

(54) TEMPORARY SELF-ALIGNED STOP LAYER IS APPLIED ON SILICON SIDEWALL

(75) Inventors: Shu-Ying Cho, Hsin-Chu (TW); Chien-Ming Chung, Hsin-Chu (TW); Yuan-Chang Huang, Hsin-Chu (TW)

(73) Assignee: Taiwan Semiconductor Manufacturing Company, (TW)

( * ) Notice: Subject to any disclaimer, the term of this patent is extended or adjusted under 35 U.S.C. 154(b) by 65 days.

(21) Appl. No.: 10/754,833

(22) Filed: Jan. 9, 2004

(65) Prior Publication Data

US 2005/0151203 A1   Jul. 14, 2005

(51) Int. Cl.[7] .......................................... H01L 21/336
(52) U.S. Cl. ................ 438/197; 438/184; 438/199; 438/224; 438/225; 438/231; 438/301; 438/558; 257/336; 257/374; 257/408; 257/900
(58) Field of Search ................ 438/184, 197, 438/199, 224, 225, 230, 231, 297, 301, 303, 438/305, 362, 439, 558, 595; 257/336, 374, 257/408, 900

(56) References Cited

U.S. PATENT DOCUMENTS

| | | | | |
|---|---|---|---|---|
| 5,391,508 A | | 2/1995 | Matsuoka et al. | 437/41 |
| 5,648,287 A | * | 7/1997 | Tsai et al. | 438/305 |
| 5,710,054 A | * | 1/1998 | Gardner et al. | 438/304 |
| 5,759,885 A | * | 6/1998 | Son | 438/230 |
| 5,905,293 A | * | 5/1999 | Jeng et al. | 257/408 |
| 6,136,636 A | * | 10/2000 | Wu | 438/231 |
| 6,153,455 A | * | 11/2000 | Ling et al. | 438/231 |
| 6,335,253 B1 | | 1/2002 | Chong et al. | 438/305 |
| 6,627,502 B1 | * | 9/2003 | Cho | 438/265 |
| 2002/0192868 A1 | * | 12/2002 | Kim | 438/112 |

* cited by examiner

Primary Examiner—W. David Coleman
Assistant Examiner—Belur V. Keshavan (57) ABSTRACT

A method is provided for forming NMOS and PMOS transistors with ultra shallow source/drain regions having high dopant concentrations. First sidewall spacers and nitride spacers are sequentially formed on the sides of a gate electrode followed by forming a self-aligned oxide etch stop layer. The nitride spacer is removed and an amorphous silicon layer is deposited. The etch stop layer enables a controlled etch of the amorphous silicon layer to form silicon sidewalls on the first sidewall spacers. Implant steps are followed by an RTA to activate shallow and deep S/D regions. The etch stop layer maintains a high dopant concentration in deep S/D regions. After the etch stop is removed and a titanium layer is deposited on the substrate, an RTA forms a titanium silicide layer on the gate electrode and an extended silicide layer over the silicon sidewalls and substrate which results in a low resistivity.

25 Claims, 8 Drawing Sheets

TEMPORARY SELF-ALIGNED STOP LAYER IS APPLIED ON SILICON SIDEWALL

RELATED PATENT APPLICATION

This application is related to the following: Ser. No. 10/279,898, filing date Oct. 24, 2002, assigned to a common assignee.

FIELD OF THE INVENTION

The invention relates to a method of fabricating an integrated circuit in a semiconductor device. More particularly, the present invention is directed to a method of manufacturing NMOS and PMOS transistors with shallow junctions and an extended salicide structure.

BACKGROUND OF THE INVENTION

Figure 1:
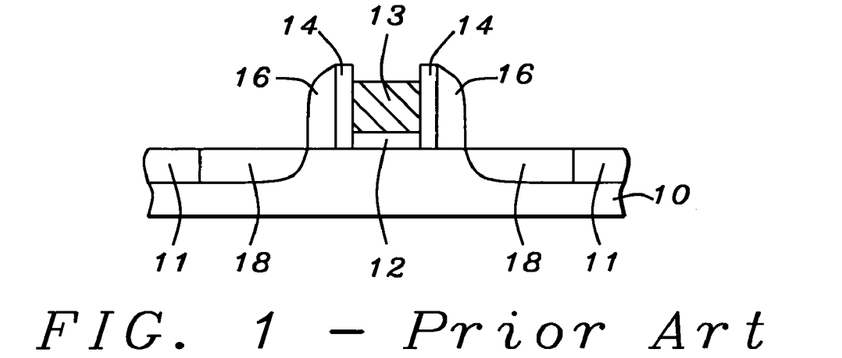
FIG. 1 depicts a prior art example of a MOSFET with deep source/drain regions and dual sidewall spacers.

As technology advances into the regime of sub-100 nm gate lengths in order to increase transistor speed in MOSFET (Metal Oxide Semiconductor Field Effect Transistor) devices, there is a need to improve the performance of source/drain regions which define the channel length. A conventional MOSFET as fabricated in prior art is shown in FIG. 1 and is comprised of a substrate 10 with insulating regions 11 such as shallow trench isolation (STI) regions that separate active areas upon which a gate dielectric layer 12 and a gate electrode 13 are formed. A cap layer (not shown) is optional above the gate electrode 13 which is also referred to as a gate conductor layer. A first sidewall spacer 14 and sidewall 16 are formed on each side of the gate electrode. Then self-aligned source/drain regions 18 are formed by an ion implant process. The length of the channel is the distance between source and drain regions 18.

When the device design shrinks to provide faster transistors, the gate length (width of gate electrode 13) and channel length become shorter. One effect of a shorter channel is a hot electron effect that occurs when electrons introduced to a strong electric field near the drain region 18 generate hot carriers that may accumulate in the gate dielectric layer 12 and reduce the reliability of the MOSFET. A second problem with short channels is an increase in the resistivity of source/drain regions because of a shallower depth and a smaller conductive area. Likewise, the gate electrode 13 has an increase in wiring resistance or resistivity as the gate length decreases. As the resistivity becomes larger, the transistor speed decreases.

Figure 2A:
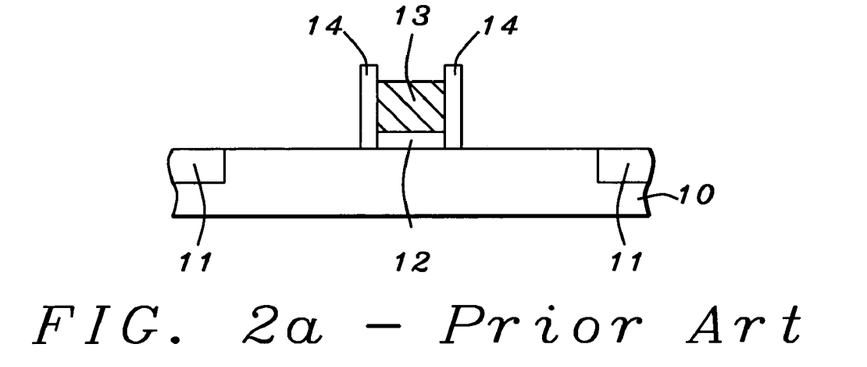
FIGS. 2a–2c are cross-sectional views of a prior art method of forming a MOSFET with shallow source/drain regions.
Figure 2B:
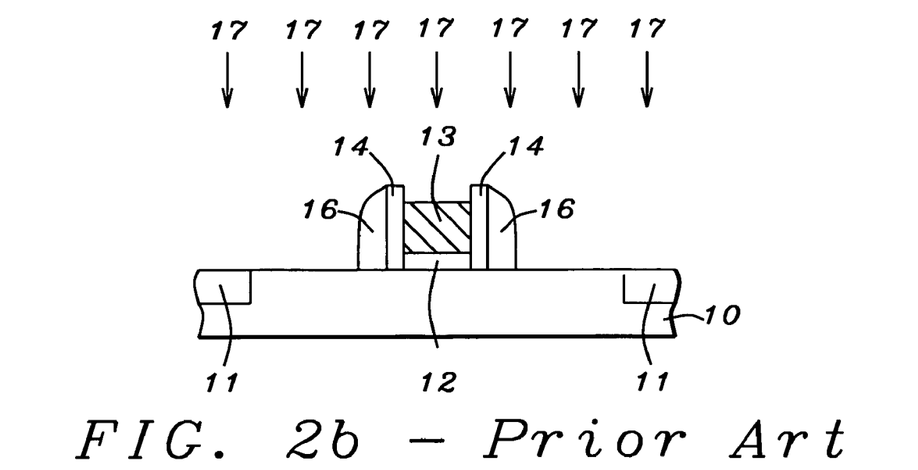
Figure 2C:
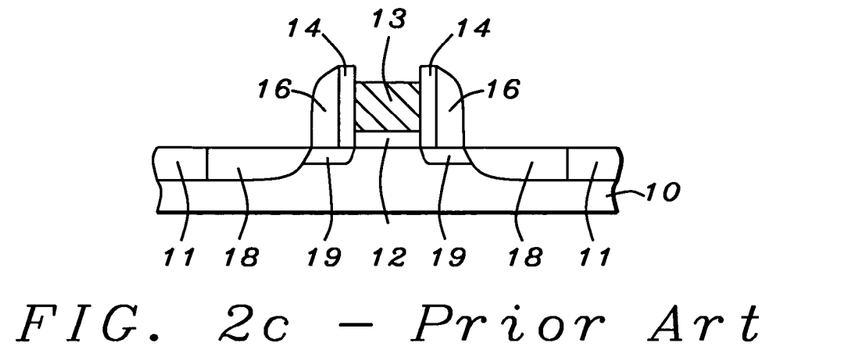

To offset the undesirable consequences of short channel effects in a MOSFET depicted in FIG. 1, two improvements have been adapted by IC manufacturers. First, shallow source/drain regions 19 as illustrated in FIG. 2c have been introduced. These are shallow regions that have a lower doping of an impurity ion while adjacent deep source/drain regions 18 have a higher doping of the same impurity. When the source/drain regions 18 and 19 are offset, the resulting structure is called a lightly doped drain (LDD) structure. An LDD structure generally helps to prevent the hot electron effect. For conventional LDD structures, there is a trade-off between an ultra-shallow junction region and a high impurity concentration and it is difficult to achieve both desirable features at the same time.

U.S. Pat. No. 5,905,293 offers a method of forming an LDD structure with an improved contact etch window and tighter control of LDD length. An ion implant is employed to form a lightly doped source/drain region and dual spacers adjacent -to the gate electrode serve to control the LDD width.

A second method for improving MOSFET performance involves formation of metal salicide layers on the gate electrode and above the highly doped source/drain regions. A metal such as titanium is deposited on a substrate and reacts with silicon regions during a heat treatment to form a metal silicide. When the metal silicide layers are formed in a self-aligned manner, the result is called a salicide structure. Since the metal silicide layers are conductors, the wiring resistance of the gate electrode and the sheet resistance of the source/drain regions are reduced and thereby a faster transistor is achieved.

An example of a salicide structure is found in U.S. Pat. No. 5,648,287 which in combination with an LDD structure is used to form quarter micron MOSFETs. The method employs an ion implant technique to introduce impurity ions in LDD regions. However, the depth and uniformity of ion implants in shallow source/drain regions may be difficult to control and may lead to a degradation in device performance.

In U.S. Pat. No. 6,136,636, a salicide method is included with a thermal diffusion step to form a dual well MOSFET. Thermal diffusion from a sidewall layer is used to drive a dopant into the underlying substrate to form a lightly doped source/drain region. One drawback is that the dopant must pass through a silicon oxide layer before it reaches the substrate and this extra layer diminishes the concentration of impurity ions in the LDD region. A steam oxidation during the thermal diffusion converts the amorphous silicon sidewall into $SiO_2$ and also forms a thin $SiO_2$ layer on exposed substrate. However, during the oxide formation, some of the implanted ions may diffuse out of the substrate and reduce the dopant concentration.

An alternative method of diffusing a doped impurity is described in U.S. Pat. No. 6,335,253. Besides ion implants to form lightly and heavily doped regions, a third ion implant forms an amorphous silicon layer that is later melted with laser radiation to drive diffusion. This process is more complicated because of the additional ion implant step and the laser radiation which must be carefully controlled to avoid melting adjacent substrate regions.

Another example of shallow source/drain regions is mentioned in U.S. Pat. No. 5,391,508. Thermal diffusion from a semiconductor sidewall on the gate electrode drives implanted ions into the substrate to form shallow source/drain regions.

A related TSMC application Ser. No. 10/279,898 is herein incorporated as a reference and describes a method of forming a MOSFET by solid phase diffusion from silicon sidewalls as represented in FIGS. 2a–2c. A gate dielectric layer 12 and a gate electrode 13 are patterned between STI regions 11 on the substrate 10. Sidewall spacers 14 are formed on opposite sides of the gate electrode and then sidewalls 16 are formed adjacent to the sidewall spacers 14. Next, impurity ions 17 are implanted into the substrate 10, sidewall spacers 14, sidewalls 16, and into gate electrode 13. Source/drain regions 18 and 19 in FIG. 2c are formed by activation with a heat treatment during which impurity ions near the surface of the substrate 10 are driven further into substrate 10 to form deep source/drain regions 18. Meanwhile, thermal diffusion from sidewall 16 drives impurity ions into the substrate 10 to form lightly doped source/drain regions 19. One concern with this approach is that the etch back of a polysilicon layer to form sidewalls 16 is not controllable since a sidewall 16 is comprised of the same material as the substrate 10 and an etch endpoint is difficult to determine.

Therefore, an improved method of forming shallow source/drain regions by thermal diffusion from a sidewall is needed that is more controllable. The method should also be compatible with formation of a salicide structure that will improve conductivity and provide a faster transistor speed in the final device.

SUMMARY OF THE INVENTION

One objective of the present invention is to provide a means of forming a MOSFET or MOS transistor having silicide contacts to the gate electrode and source/drain regions that are electrically isolated, said contacts will reduce the series resistance of the shallow and deep source/drain regions.

A further objective of the present invention is to provide a method of forming a MOS transistor with shallow source/drain regions that are thermally activated by solid phase diffusion from a sidewall directly into the underlying substrate.

A still further objective of the present invention is to provide a method of fabricating a MOS transistor that prevents shorting or bridging between the silicide on the gate electrode and the silicide over the source/drain regions.

A still further objective of the present invention is to provide a reliable and manufacturable method of forming a MOSFET with shallow source/drain regions and a salicide structure used in fabricating an integrated circuit device.

These objectives are achieved by providing a substrate with isolation regions such as STI (shallow trench isolation) regions that separate partially formed transistors comprised of a first active region overlying an N-well and a second active region overlying a P-well in the substrate. A gate dielectric layer is formed on the first and second active regions and a first gate electrode is fabricated on the gate dielectric layer in the first active region while a second gate electrode is formed on the gate dielectric layer in the second active region. A first sidewall spacer comprised of silicon oxide is formed on each side of the first and second gate electrodes and then a silicon nitride layer is deposited and etched back to form a second sidewall spacer adjacent to each of the first sidewall spacers. In a subsequent step, thermal oxidation is employed to grow a thin oxide layer on the exposed substrate. After the second sidewall spacers are removed, a layer of amorphous silicon is deposited and is etched back to form silicon sidewalls on the first sidewall spacers with a similar size and location as the previous second sidewall spacers. The thin oxide layer serves as an etch stop to allow a controllable silicon sidewall etch. At this point the amorphous silicon may be annealed in a nitrogen ambient to form a more crystalline silicon sidewall.

Next, a first photoresist layer is coated and patterned to protect the second active region over the P-well and uncover the first active region over the N-well. A first implant is performed in which a p-type dopant such as $BF_2^+$ ions are implanted into the first active region including the first gate electrode and adjacent sidewall spacers and silicon sidewalls. The first photoresist layer is removed and then a second photoresist layer is coated and patterned to protect the first active region and uncover the second active region. A second implant is performed in which an n-type dopant such as $P^{31+}$ ions are implanted into the second active region including the second gate electrode and adjacent sidewall spacers and silicon sidewalls. After the second photoresist is removed, a rapid thermal anneal (RTA) of the substrate activates the source/drain regions as the impurity ions from both implants are driven into the substrate in active regions underlying the thin oxide etch stop layer to form deep source/drain regions. Meanwhile, a thermal solid phase diffusion of the impurity ions from the silicon sidewalls into the substrate forms shallow source/drain regions adjacent to the deep source/drain regions. The thin silicon oxide etch stop layer prevents out diffusion of the dopant from the deep source/drain regions.

Next, the thin etch stop layer is removed. A metal layer that is preferably titanium is deposited and an RTA is used to form a silicide layer where the metal is in contact with silicon. In other words, a silicide layer is formed above the gate electrode and above the deep/source drain regions and on the silicon sidewalls. Unreacted metal is removed in a subsequent step which results in an extended silicide layer that reduces the series resistance of the source/drain regions and prevents short channel effects Alternatively, a partially formed MOS transistor comprised of a gate dielectric layer and an overlying gate electrode with first sidewall spacers is formed on an active region between isolation regions. A sequence of forming second spacers adjacent to the first sidewall spacers, oxidizing the exposed substrate, and removing the second spacers is performed as in the first embodiment. A layer of amorphous silicon is deposited and is etched back to form silicon sidewalls on the first sidewall spacers with a similar size and location as the previous second spacers. The amorphous silicon spacers may be annealed. An implant is performed to dope the gate electrode, first sidewall spacers, silicon sidewalls, the etch stop layer on the substrate, and the substrate below the etch stop layer. An RTA of the substrate activates the source/drain regions as the impurity ions from the implant are driven into the substrate in active regions underlying the thin etch stop layer to form deep source/drain regions. Meanwhile, a thermal solid phase diffusion of the impurity ions from the silicon sidewalls into the substrate forms shallow source/drain regions adjacent to the deep source/drain regions. The etch stop layer is removed and an extended silicide layer is formed on the silicon sidewalls and over the adjacent substrate. The silicide layer formed on the gate electrode is separated from the extended silicide layer by the first sidewall spacers.

DETAILED DESCRIPTION OF THE INVENTION

Figure 3A:
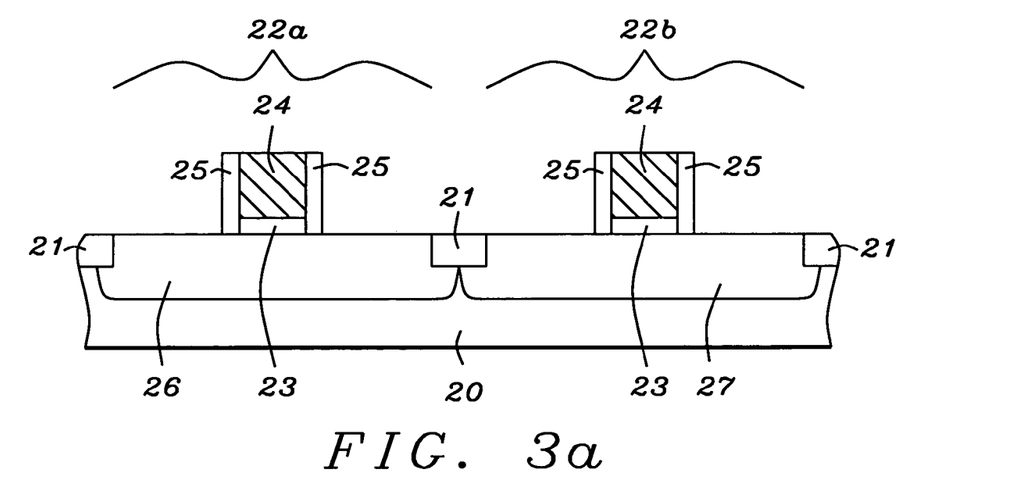
FIGS. 3a–3h are cross-sectional views that illustrate a method of forming adjacent PMOS and NMOS transistors having shallow source/drain regions and an extended salicide structure according to the present invention.

The present invention is a method of forming a transistor on a semiconductor substrate in which silicon sidewalls are formed adjacent to first sidewall spacers next to a gate electrode. The silicon sidewalls enable an extended salicide structure to be fabricated in a subsequent sequence of steps that lead to a lower resistivity. In one embodiment, a method is provided for forming NMOS and PMOS transistors simultaneously on a substrate. In a second embodiment, a method is described for fabricating a MOS transistor according to the present invention. The drawings are provided by way of example and are not intended to limit the scope of the invention The first embodiment is illustrated in FIGS. 3a–3h. Referring to FIG. 3a, a substrate 20 is provided with isolation regions 21 that may be shallow trench isolation (STI) regions, for example. The isolation regions 21 separate a first active region 22a that includes an N-well 26 from a second active region 22b that has a P-well 27. The substrate 20 is preferably monocrystalline silicon. The isolation regions 21 are typically comprised of silicon oxide or a low k dielectric material such as carbon doped $SiO_2$ or fluorine doped $SiO_2$. Field oxide (FOX) regions or mesa isolation regions known to those skilled in the art may be used instead of STI regions.

A gate dielectric layer 23 is formed on the substrate 20 by a conventional method and may be comprised of silicon oxide or a high k dielectric material such as $Ta_2O_5$, $TiO_2$, $Al_2O_3$, $ZrO_2$, $HfO_2$, $Y_2O_3$, $La_2O_5$ and their aluminates and silicates. A gate that is preferably comprised of polysilicon having a thickness between about 1500 and 1800 Angstroms is deposited on the gate dielectric layer 23 by a CVD method or the like. Optionally, SiGe or SiGeC may be employed as a gate layer 24. Next a photoresist (not shown) is coated and patterned on the gate layer 24. Optionally, an anti-reflective coating (ARC) may be formed on the gate layer 24 before the photoresist coating in order to improve the process latitude of the photoresist patterning process. A plasma etch process is performed to transfer the photoresist pattern through the gate layer 24. In this process, the openings in the photoresist pattern are transferred through the gate layer 24 while the photoresist serves as a mask to protect the underlying polysilicon layer from the etchant. The photoresist is stripped to leave gate electrodes 24 preferably near the center of the first active region 22a and near the center of the second active region 22b.

The first sidewall spacers 25 are preferably formed by depositing a silicon oxide layer on the substrate and plasma etching so that only vertical columns or spacers remain adjacent to the gate electrodes 24. Optionally, the first sidewall spacers 25 may be comprised of silicon oxynitride. The width of a first sidewall spacer 25 is in the range of 150 to 200 Angstroms.

Figure 3B:
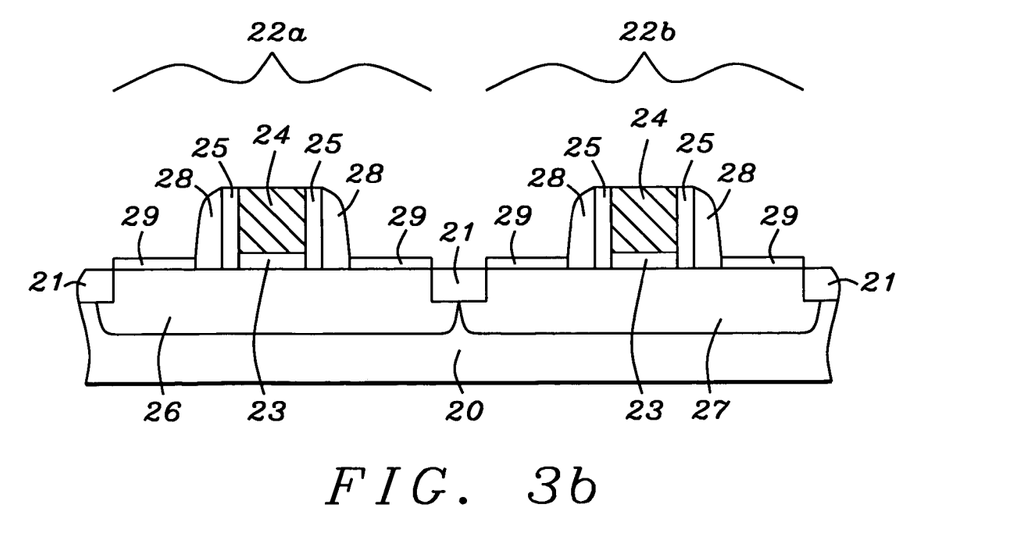

Referring to FIG. 3b, a second sidewall spacer 28 is preferably formed by depositing a silicon nitride layer by a CVD or plasma enhanced CVD (PECVD) technique and then performing an anisotropic etch. The maximum width of a second sidewall spacer 28 where it contacts the substrate 20 is in the range of about 1500 to 1600 Angstroms.

A key step in the process of the present invention is to form a thin etch stop layer 29 comprised of $SiO_2$. This temporary stop layer is preferably grown to a thickness between 30 and 200 Angstroms by thermal oxidation in a furnace using an oxygen ambient at a temperature between 300° C. and 1000° C. An alternative means of forming the oxide etch stop layer 29 is by a CVD or PECVD deposition followed by an etch to clear portions of the oxide layer that are not wanted. Note that a thin oxide layer (not shown) may also be formed on the gate electrodes 24.

Figure 3C:
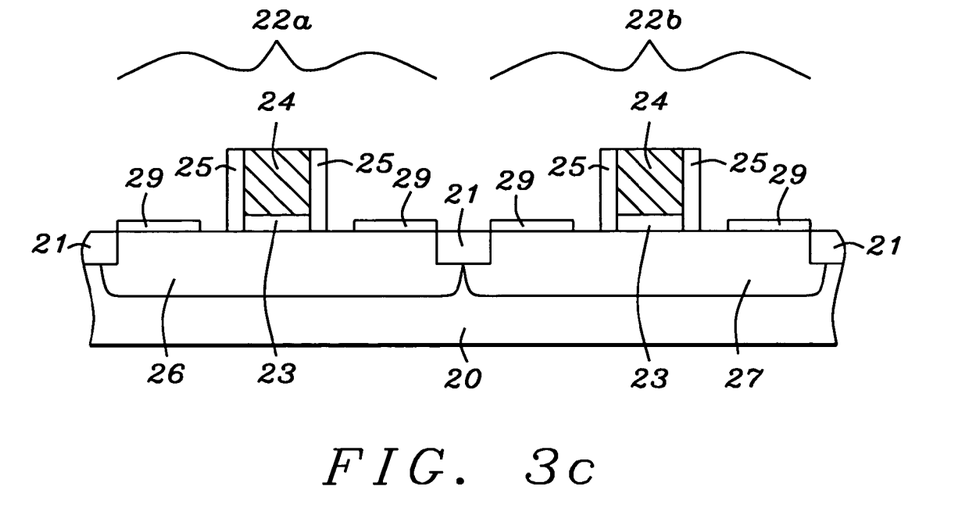

Referring to FIG. 3c, another key step is to remove the second sidewall spacers 28. In the embodiment where the second sidewall spacers 28 are silicon nitride, this step is typically done with a hot phosphoric acid etch. The first sidewall spacers 25 which are preferably $SiO_2$ serve as an etch stop in the lateral direction toward the gate electrode 24. A space between the etch stop layer 29 and a first sidewall spacer 25 remains where a second sidewall spacer 28 was removed.

Figure 3D:
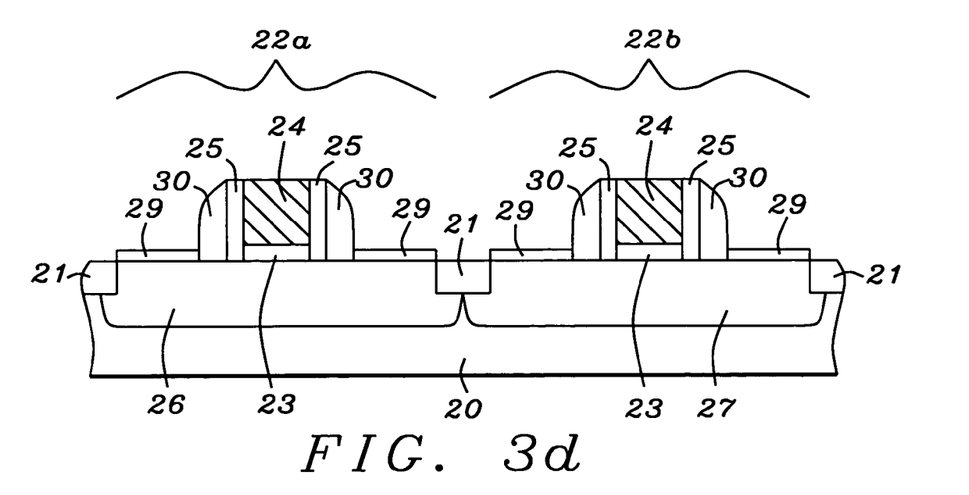

Referring to FIG. 3d, the next step is to perform a CVD deposition of an amorphous silicon layer 30 which has a thickness of between 1500 and 1600 Angstroms on the etch stop layer 29, first sidewall spacers 25, and on gate electrodes 24. The conformal coating of the amorphous silicon (α-Si) layer 30 is etched back to form a second sidewall spacer 30 adjacent to each first sidewall spacer 25. This etch also removes the α-Si layer 30 above the etch stop layer 29 and on gate electrodes 24. The α-Si layer 30 is etched back in an etcher that provides a high selectivity of silicon to oxide as appreciated by those skilled in the art. The oxide etch stop layer 29 plays an important role in determining the end point of the etch back so that the α-Si layer 30 is controllably etched and the substrate 20 is not damaged. In the embodiment where a thin oxide layer is also formed on the gate electrodes 24, the thin oxide layer prevents attack by the etchant on the gate electrodes.

Figure 3E:
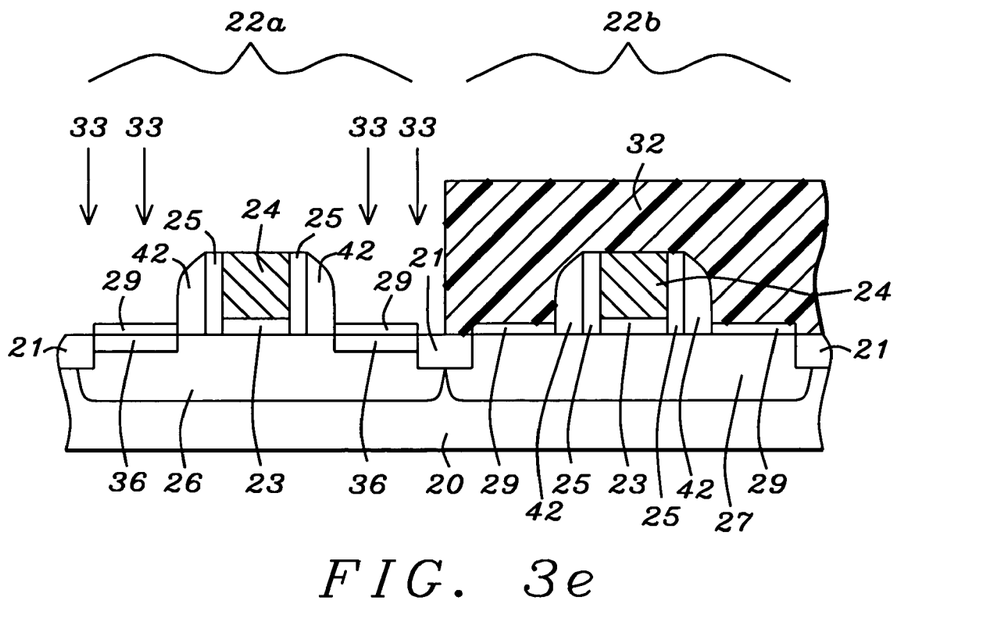

Referring to FIG. 3e, the resulting second sidewall 30 spacer is transformed to a crystalline silicon sidewall 42 by an anneal step in a nitrogen ambient that is known to those skilled in the art. A photoresist is coated on the substrate 20 and patterned to form a photoresist layer 32 on the second active region 22b that includes the P-well 27. The thickness of the photoresist layer 32 is sufficient to block any ions during a subsequent implant step from reaching the partially formed transistor in the second active region 22b.

A vertical ion implant with a p-type dopant is performed in the next step. For example, $BF_2^+$ ions 33 at an energy of about 12 to 17 KeV with a dose from about $5 \times 10^{15}$ ions/cm$^2$ to $6 \times 10^{15}$ ions/cm$^2$ introduces impurity ions into the etch stop layer 29 and into the surface of substrate 20 below the etch stop layer 29 in the first active region 22a to form a doped region 36 above the N-well 26. The impurity ions are also implanted into the silicon sidewall 42, first sidewall spacers 25 and gate electrode 24 in the first active region 22a. The etch stop layer 29 serves to reduce some of the damage to the substrate 20 in the doped region 36 caused by the ion bombardment. The photoresist layer 32 is then stripped by a conventional process. The substrate 20 may be cleaned at this point with a standard method such as treatment with a RCA solution to prevent contaminants or residue remaining after the stripping process from being driven into the substrate in a later ion implant step.

Figure 3F:
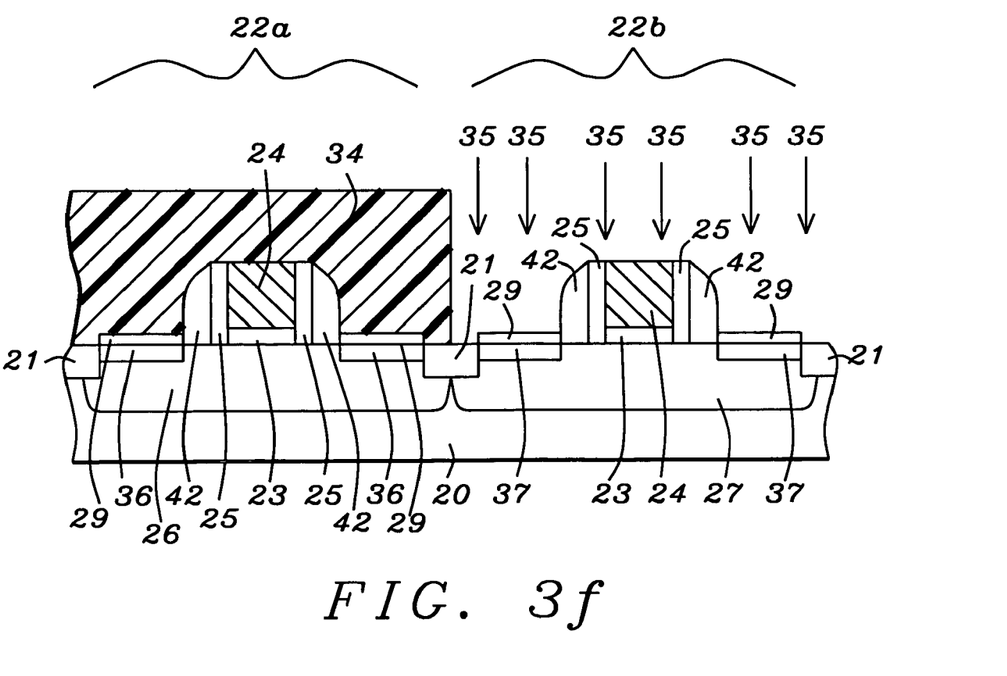

Referring to FIG. 3f, a photoresist is coated and patterned on the substrate 20 to form a photoresist layer 34 over the first active region 22a. The thickness of the photoresist layer 34 is sufficient to block any ions during a subsequent implant step from reaching the partially formed transistor in the first active region 22a. A vertical ion implant is then performed with an n-type dopant. For example, $P^{31+}$ ions 35 with an energy of about 10 to 30 KeV and a dose from about $5 \times 10^{15}$ ions/cm$^2$ to $6 \times 10^{15}$ ions/cm$^2$ introduces impurity ions into the etch stop layer 29 and into the surface of the substrate 20 below the etch stop layer 29 in the second active region 22b to form a doped region 37 above the P-well 27. The impurity ions are also implanted into the silicon sidewall 42, first sidewall spacer 25, and gate electrode 24 in the second active region 22b. The etch stop layer 29 serves to reduce some of the damage to substrate 20 in the doped region 37 caused by the ion bombardment. Note that this is an advantage over prior art where ion implants are performed directly into a substrate which is not protected by an oxide layer. The photoresist layer 34 is removed by a conventional process and the substrate 20 may be cleaned with a standard cleaning solution before a subsequent anneal step.

Figure 3G:
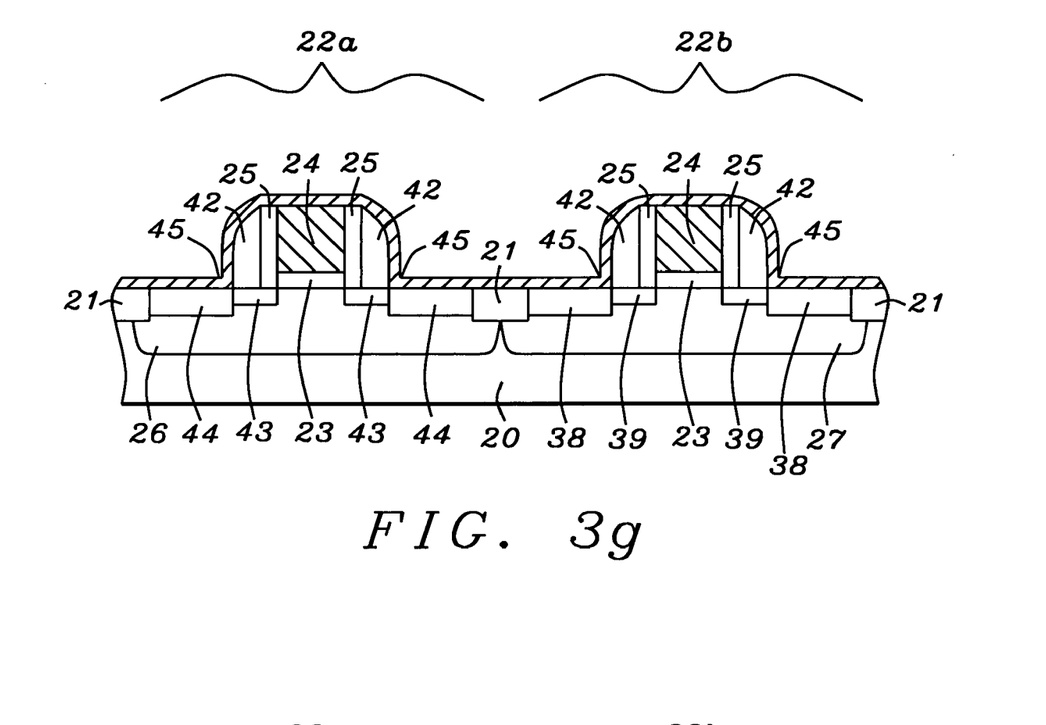

Referring to FIG. 3g, source/drain regions 38, 39, 43, 44 are then activated in the substrate 20 by a rapid thermal anneal (RTA) process. The RTA process comprises heating the substrate 20 at a temperature between about 900° C. and 1100° C. for a period of about 7 to 13 seconds in a $N_2$ atmosphere. Impurity ions in the etch stop layer 29 are driven into the substrate 20 and ions in the doped regions 36, 37 are driven deeper into the substrate 20 to form deep source/drain regions 38, 44, respectively. The etch stop layer 29 prevents impurity ions from out diffusing from deep source/drain regions 38, 44 which is important for keeping a high concentration of dopant in those regions. Meanwhile, thermal diffusion drives impurity ions contained in the silicon sidewalls 42 into the underlying substrate 20 to form shallow source/drain regions 39, 43. Note that the concentration of impurity ions in shallow source/drain regions 39, 43 is higher in this embodiment than when a $SiO_2$ layer is present between a silicon sidewall and a substrate as described in prior art examples. A $SiO_2$ layer reduces the effectiveness of solid phase diffusion. It is understood that impurity ions from a silicon sidewall 42 may diffuse laterally below an adjacent first sidewall spacer 25.

At this point the etch stop layer 29 is removed by a combination of dry and wet etching. For example, a large portion of the etch stop layer 29 may be removed by a plasma etch followed by removal of the remaining thin portion by a short buffered HF treatment to avoid damage to the silicon substrate 20. A thin oxide layer on the gate electrodes 24 is also removed during this step which may form a slight recess (not shown) on the gate electrodes.

To form a salicide structure, a metal layer 45 which is preferably titanium is deposited on the substrate 20 and on the partially formed transistors in the first and second active regions 22a, 22b with a conventional sputter process which may be an ionized metal plasma (IMP), for example. The thickness of the resulting metal layer 45 is in a range between about 100 and 200 Angstroms.

Figure 3H:
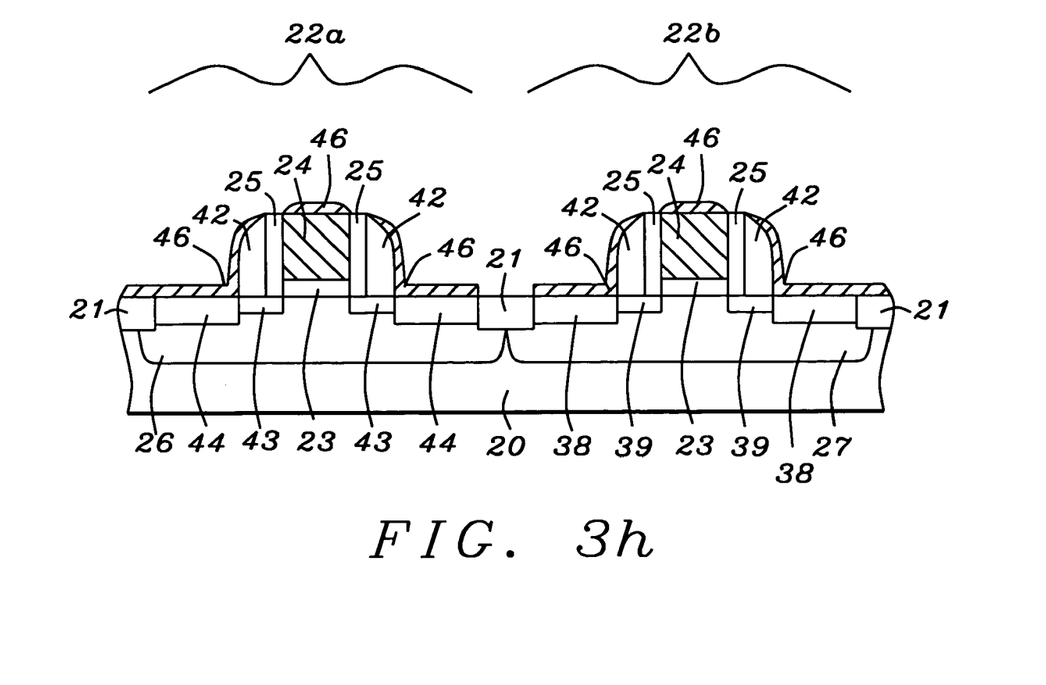

Referring to FIG. 3h, the substrate 20 is then subjected to an RTA process. In the embodiment where the metal layer 45 is titanium, the RTA comprises heating the substrate 20 at a temperature of between 730° C. and 880° C. for a period of 30 to 60 seconds and thereby forms a titanium silicide layer 46 over the gate electrodes 24, silicon sidewalls 42, and on silicon substrate 20. The unreacted metal layer 45 on the first sidewall spacers 25 and isolation regions 21 is removed. The removal of an unreacted metal layer 45 that is titanium is preferably accomplished with an etch consisting of 1:1:1 $NH_4OH$, $H_2O_2$ and $H_2O$ at a temperature between about 30° C. and 50° C. Note that the first sidewall spacers 25 prevent shorting (bridging) between a silicide layer 46 over a gate electrode 24 and the extended silicide layer 46 on a silicon sidewall 42 and over the substrate 20. Those skilled in the art appreciate that the metal layer 45 may optionally be comprised of one or more of Ni, Co, W, Ta, Pt, Er, Hf, Al, and Pd and that the RTA temperature and method of removing unreacted metal after the silicide formation may be adjusted accordingly.

The present invention provides an advantage over prior art in that it combines several desirable features in one MOSFET device. A silicon sidewall 42 is employed as a thermal diffusion source to drive dopant into the underlying substrate 20 to form shallow source/drain regions 39, 43 and is later used to form a silicide layer 46 that extends over the adjacent deep source/drain regions 38, 44. The extended silicide layer 46 is highly effective in reducing the series resistance of the source/drain regions 38, 39, 43, and 44 and preventing short channel effects. Since a silicon sidewall 42 is in direct contact with the underlying substrate 20, a maximum concentration of impurity ions is formed in the shallow source/drain regions 39, 43. Therefore, ultra shallow junction regions 39, 43 are achieved simultaneously with a high impurity concentration in the same shallow source/drain region. The temporary etch stop layer 29 enables the adjacent α-silicon sidewall 30 to be etched in a controllable manner, minimizes ion implant damage to the substrate 20, and maintains a high dopant concentration within the deep source/drain regions 38, 44 during the thermal activation step. All these qualities provide a highly reliable, high performance device.

In a second embodiment, a MOS transistor is formed on a semiconductor substrate according to a method of the present invention and may be either a PMOS or an NMOS transistor. The second embodiment is set forth in FIGS. 4a–4f.

Figure 4A:
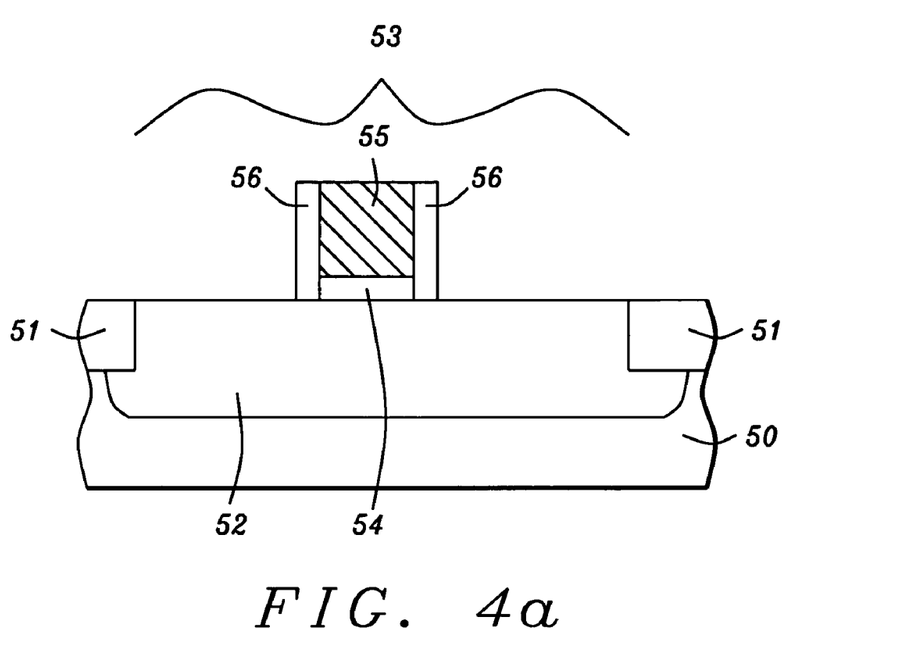
FIGS. 4a–4f are cross-sectional views that depict a method of forming a MOS transistor which has shallow source/drain regions next to deep source/drain regions and an extended salicide layer according to a second embodiment of the present invention.

Referring to FIG. 4a, a substrate 50 is provided that is typically monocrystalline silicon but may be comprised of other semiconductor materials used in the art such as silicon on insulator or SiGe. Isolation regions 51 that may be shallow trench isolation regions are comprised of an insulating material such as $SiO_2$ or a low k dielectric material. The isolation regions 51 are formed in the substrate 50 and define an active region 53 that includes an n-well or a p-well region 52.

A dielectric layer 54 comprised of silicon oxide or a high k dielectric material as described previously is formed on the substrate 50. A gate layer 55 that is preferably polysilicon having a thickness between about 1500 and 1800 Angstroms is deposited on the dielectric layer 54. Optionally, the gate layer may be comprised of SiGe, SiGeC, or amorphous silicon. A conventional patterning and etching sequence involving a photoresist layer (not shown) is followed to generate a gate electrode 55 and an underlying gate dielectric layer 54 that are preferably aligned near the center of the active region 53.

The first sidewall spacers 56 are formed by depositing a silicon oxide layer on the substrate 50 and plasma etching so that only vertical columns or spacers remain adjacent to the gate electrode 55. Optionally, the first sidewall spacers 56 may be comprised of silicon oxynitride. The width of a first sidewall spacer 56 is in the range of 150 to 200 Angstroms.

Figure 4B:
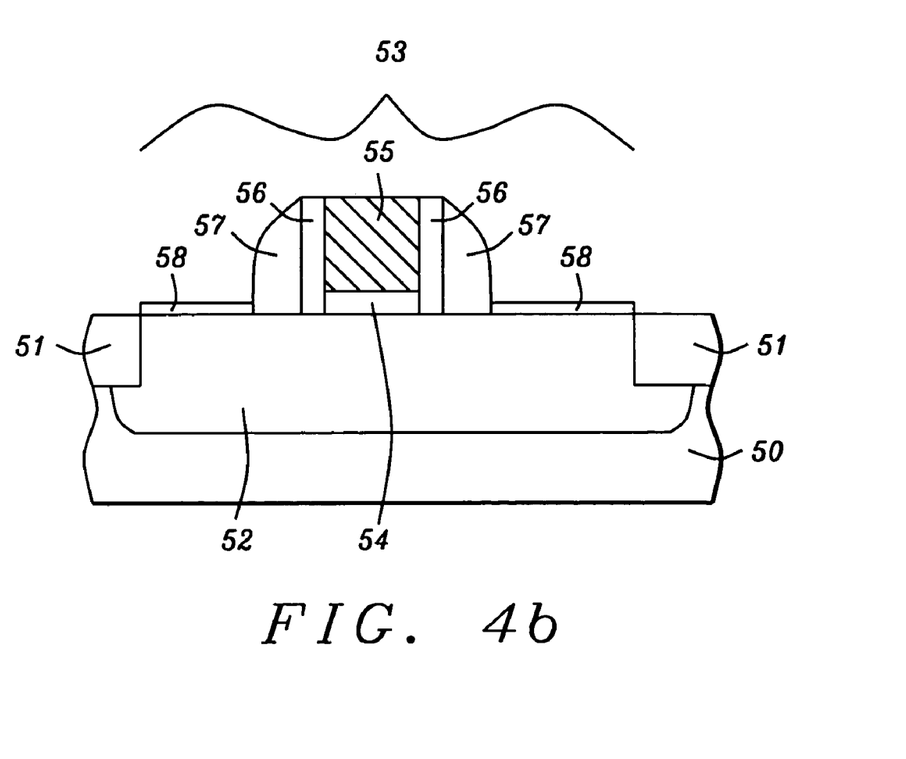

Referring to FIG. 4b, a second sidewall spacer 57 is preferably formed by depositing a silicon nitride layer by a CVD or PECVD technique and then performing an anisotropic etch. The width of a second sidewall spacer 57 at its widest point where it contacts the substrate 50 is in the range of about 1500 to 1600 Angstroms.

A key step in the process of the present invention is to form a thin etch stop layer 58 comprised of silicon oxide on the exposed substrate 50. This temporary etch stop layer is preferably grown to a thickness between about 30 and 200 Angstroms by thermal oxidation in a furnace using an oxygen ambient at a temperature between 300° C. and 1000° C. An alternative means of forming an oxide etch stop layer 58 is by a CVD or PECVD deposition followed by an etch to clear portions of the silicon oxide layer that are not wanted. Note that a thin oxide layer (not shown) may also be formed on the gate electrode 55.

Figure 4C:
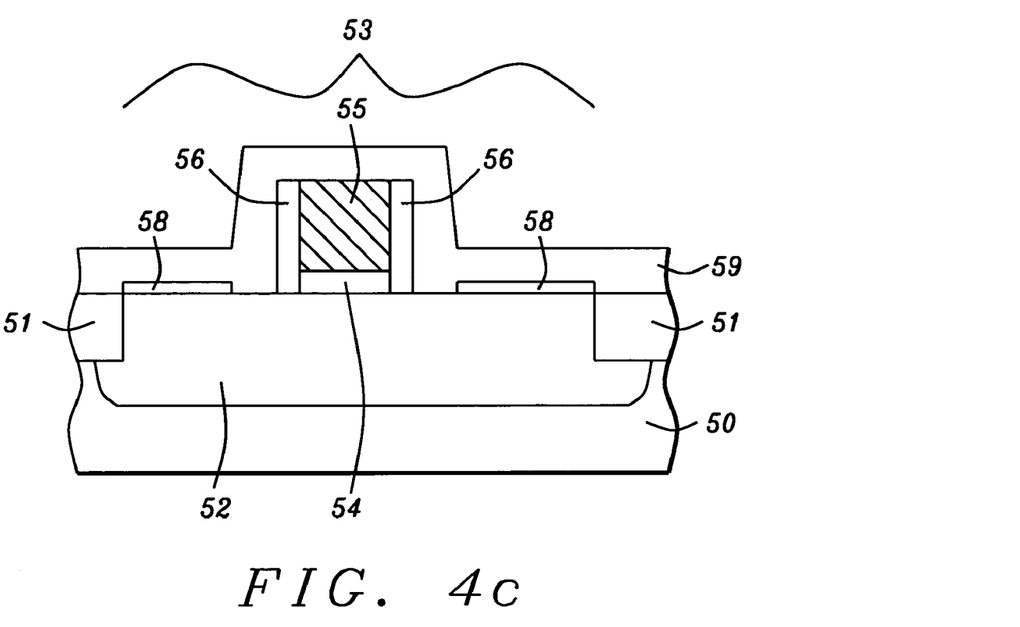

Referring to FIG. 4c, another key step is to remove the second sidewall spacers 57. In the embodiment where the second sidewall spacers 57 are silicon nitride, this step is typically done with a hot phosphoric acid etch. The first sidewall spacers 56 which are preferably $SiO_2$ serve as an etch stop in the lateral direction toward the gate electrode 55. A space between the etch stop layer 58 and a first sidewall spacer 56 remains where a second sidewall spacer 57 was removed. The next step is to perform a CVD deposition of an amorphous silicon (α-Si) layer 59 which has a thickness of between 1500 and 1600 Angstroms on the etch stop layer 58, first sidewall spacers 56, and on the gate electrode 55.

Figure 4D:
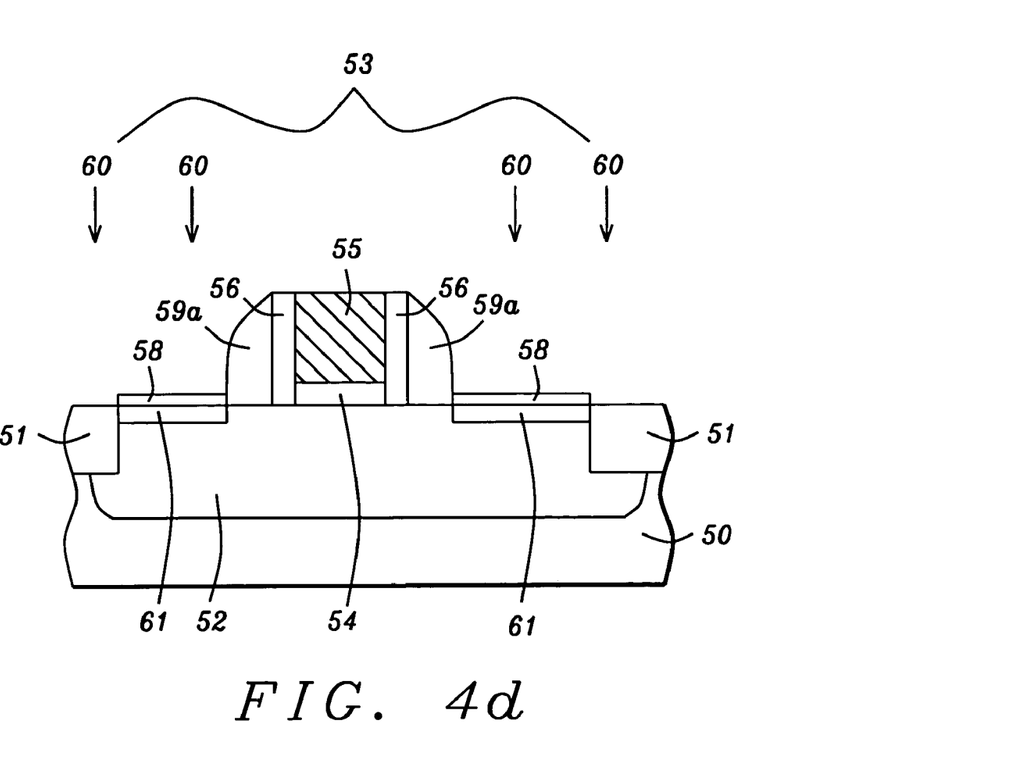

Referring to FIG. 4d, the conformal coating of the α-Si layer is etched back to form a second sidewall spacer 59 adjacent to each first sidewall spacer 56. This etch also removes the α-Si layer above the etch stop layer 58 and on the gate electrode 55. The α-Si layer 59 is etched back in an etcher that provides a high selectivity of silicon to oxide as appreciated by those skilled in the art. The presence of a thin oxide layer on the gate electrode 55 also prevents the etch back process from overetching the gate electrode. The resulting second sidewall spacer or silicon sidewall 59 is transformed to a crystalline silicon sidewall 59a by an anneal step in a nitrogen ambient that is known to those skilled in the art.

In the embodiment where the active region 53 includes an n-well 52, a vertical ion implant with a p-type dopant is performed. For example, $BF_2^+$ ions 60 with an energy of about 12 to 17 KeV and a dose from about $5\times10^{15}$ ions/cm$^2$ to $6\times10^{15}$ ions/cm$^2$ may be implanted into the etch stop layer 58 and into the surface of substrate 50 below the etch stop layer 58 to form a doped region 61 above an N-well 52. Alternatively, when the active region 53 includes a p-well 52, a vertical ion implant with an n-type dopant is performed. For example, $P^{31+}$ ions 60 with an energy of about 10 to 30 KeV and a dose from about $5\times10^{15}$ ions/cm$^2$ to $6\times10^{15}$ ions/cm$^2$ may be implanted into the etch stop layer 58 and into the surface of the substrate 50 below the etch stop layer 58 to form a doped region 61 above a P-well 52. It is understood that selected regions of the substrate 50 may be protected by a photoresist layer (not shown) before the ion implant process in order to prevent an ion implant in selected regions. Any photoresist layer on the substrate after the implant step is removed by a conventional process and the substrate 50 may be cleaned with a standard cleaning solution before a subsequent anneal step.

Figure 4E:
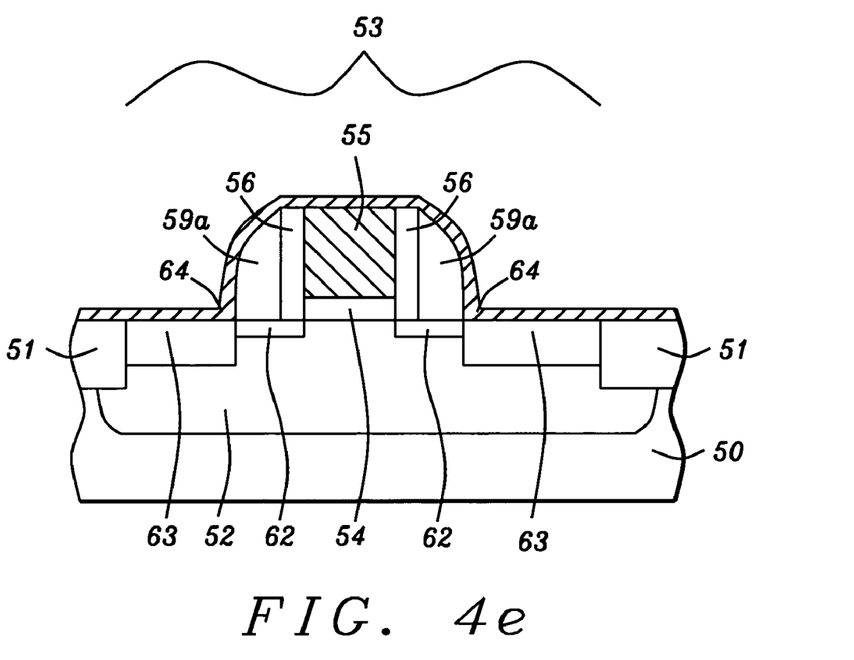

Referring to FIG. 4e, source/drain regions 62, 63 are activated in the substrate 50 by an RTA process which comprises heating the substrate 50 at a temperature between about 900° C. and 1100° C. for a period of about 7 to 13 seconds in a $N_2$ atmosphere. Impurity ions in the etch stop layer 58 are driven into the substrate 50 and ions in the doped regions 61 are driven deeper into substrate 50 to form deep source/drain regions 63. The etch stop layer 58 also prevents impurity ions from out diffusing from the deep source/drain regions 63 which is important for keeping a high concentration of dopant in those regions. Meanwhile, thermal diffusion drives impurity ions contained in the silicon sidewalls 59a into the underlying substrate 50 to form shallow source/drain regions 62. Note that the concentration of impurity ions in shallow source/drain regions 62 is higher in this embodiment than when a $SiO_2$ layer is present between a silicon sidewall and a substrate as described in prior art examples. A $SiO_2$ layer reduces the effectiveness of solid phase diffusion. It is understood that impurity ions from a silicon sidewall 59a may diffuse laterally below an adjacent first sidewall spacer 56.

The etch stop layer 58 is removed by a combination of dry and wet etching. For example, a large portion of the etch stop layer 58 may be removed by a plasma etch followed by removal of the remaining thin portion by a short buffered HF treatment to avoid damage to the substrate 50. A thin oxide layer on the gate electrode 55 is also removed during this step.

A salicide structure is formed by first depositing a metal layer 64 that is preferably titanium on the substrate 50 and on the partially formed transistors in the active regions 53 with a conventional sputter process that may be an IMP method, for example. The thickness of the resulting metal layer 64 is in a range between about 100 and 200 Angstroms. Those skilled in the art appreciate that the metal layer 64 may optionally be comprised of one or more of Ni, Co, W, Ta, Pt, Er, Hf, Al, and Pd.

Figure 4F:
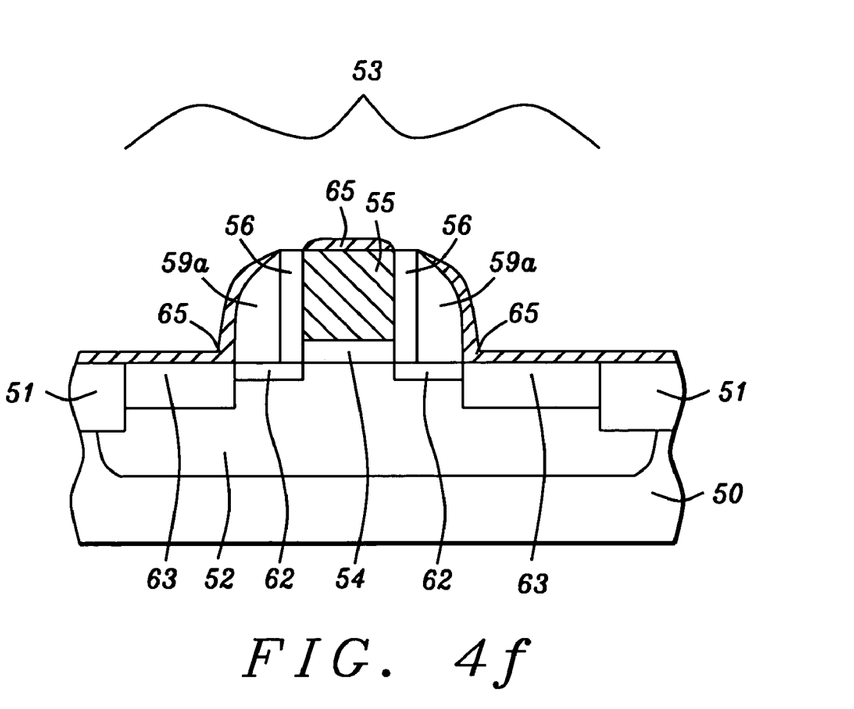

Referring to FIG. 4f, the substrate 50 is then subjected to a rapid thermal anneal to form a silicide layer 65 over the gate electrode 55, silicon sidewalls 59a, and on the substrate 50. When the metal layer 64 is titanium, the anneal is performed at a temperature of between 730° C. and 880° C. for a period of 30 to 60 seconds. Unreacted metal layer 64 above the first sidewall spacers 56 and isolation regions 51 is removed by an appropriate etchant. The removal of unreacted titanium is preferably carried out with an etch consisting of 1:1:1 $NH_4OH$, $H_2O_2$ and $H_2O$ at a temperature between about 30° C. and 50° C. Note that the first sidewall spacers 56 prevent shorting (bridging) between a silicide layer 65 over the gate electrode 55 and an extended silicide layer on a silicon sidewall 59a and the adjacent substrate 50.

The advantages provided by the second embodiment are the same as those mentioned previously. The extended silicide layer formed by the present invention is highly effective in reducing the series resistance of the shallow source/drain regions 62, and deep source/drain regions 63 and preventing short channel effects. Moreover, ultra shallow source/drain regions 62 are formed with a high concentration of dopant unlike prior art methods with an oxide layer between the sidewall spacers and underlying substrate. The temporary etch stop layer 58 enables the adjacent α-silicon sidewall 59 to be etched in a controllable manner, minimizes ion implant damage to the substrate 50, and maintains a high dopant concentration within the deep source/drain regions 63 during the thermal activation step. Thus, a MOS transistor is formed which is highly reliable and has high performance.

While this invention has been particularly shown and described with reference to, the preferred embodiment thereof, it will be understood by those skilled in the art that various changes in form and details may be made without departing from the spirit and scope of this invention.

We claim:

1. A method of forming a MOS transistor on a semiconductor substrate, comprising;
    (a) providing a substrate having isolation regions and an active region formed therebetween, said active region has a gate dielectric layer formed thereon and a gate electrode with two sides on the gate dielectric layer;
    (b) forming a temporary sidewall spacer on opposite sides of the gate electrode;
    (c) forming a temporary etch stop layer between an isolation region and an adjacent temporary sidewall spacer;
    (d) removing said temporary sidewall spacers and replacing with permanent sidewall spacers;
    (e) implanting impurity ions in said gate electrode, permanent sidewall spacers, etch stop layer, and in the substrate in the active region and performing a rapid thermal anneal (RTA) to activate shallow source/drain regions and deep source/drain regions in said active region, (f) removing the temporary etch stop layer to expose portions of the substrate; and (g) forming a metal silicide layer on the exposed portions of substrate, permanent sidewall spacers, and on the gate electrode.

2. The method of claim 1 further comprised of forming a first sidewall spacer on opposite sides of the gate electrode before forming the temporary sidewall spacers.

3. The method of claim 2 wherein said first sidewall spacer is comprised of silicon oxide or silicon oxynitride having a width between about 150 and 200 Angstroms.

4. The method of claim 1 wherein said substrate is comprised of silicon and the gate electrode is polysilicon and has a thickness between about 1500 and 1800 Angstroms.

5. The method of claim 1 wherein said temporary sidewall spacers are comprised of silicon nitride having a width from about 1500 to 1600 Angstroms.

6. The method of claim 1 wherein said temporary etch stop layer is silicon oxide with a thickness from about 30 to 200 Angstroms and which is formed by a thermal oxidation in an $O_2$ ambient at a temperature between about 300° C. and 1000° C.

7. The method of claim 6 wherein a thin oxide layer is formed on the gate electrode during said thermal oxidation and said thin oxide layer is subsequently removed during removal of the temporary etch stop layer.

8. The method of claim 1 wherein said permanent sidewall spacers are formed by depositing an amorphous silicon layer which is subsequently etched back.

9. The method of claim 8 wherein the substrate having said permanent sidewall spacers is annealed in a $N_2$ ambient to form crystalline silicon sidewall spacers before the implant step.

10. The method of claim 1 wherein said RTA step is performed by heating the substrate in a $N_2$ atmosphere at a temperature between about 900° C. and 1100° C. for a period between about 7 and 13 seconds.

11. The method of claim 1 wherein the metal deposited on said substrate to form a silicide is titanium or one or more of Ni, Co, W, Ta, Pt, Er, Hf, Al, and Pd.

12. A method of forming a PMOS and an NMOS transistor on a semiconductor substrate comprising the steps of:

(a) providing a substrate having isolation regions and a first active region with an n-well and a second active region with a p-well formed therebetween, said first and second active regions have a gate dielectric layer formed thereon and a gate electrode with two sides on the gate dielectric layer;

(b) forming a temporary sidewall spacer on opposite sides of the gate electrodes;

(c) forming a temporary etch stop layer between an isolation region and an adjacent temporary sidewall spacer;

(d) removing said temporary sidewall spacers and replacing with permanent sidewall spacers;

(e) implanting a p-type dopant in said gate electrode, permanent sidewall spacers, etch stop layer, and in the substrate in the first active region;

(f) implanting an n-type dopant in said gate electrode, permanent sidewall spacers, etch stop layer, and in the substrate in the second active region;

(g) performing a rapid thermal anneal to form shallow source/drain regions and deep source/drain regions in said first and second active regions, (h) removing the temporary etch stop layer to expose portions of the substrate; and (i) forming a metal silicide layer on the exposed portions of substrate, permanent sidewall spacers, and on the gate electrodes.

13. The method of claim 12 further comprised of forming a first sidewall spacer adjacent to the gate electrodes before forming a temporary sidewall spacer.

14. The method of claim 13 wherein said first sidewall spacer is comprised of silicon oxide or silicon oxynitride having a width between about 150 and 200 Angstroms.

15. The method of claim 12 wherein said substrate is comprised of silicon and the gate electrode is polysilicon and has a thickness between about 1500 and 1800 Angstroms.

16. The method of claim 12 wherein said temporary sidewall spacers are comprised of silicon nitride having a width from about 1500 to 1600 Angstroms.

17. The method of claim 12 wherein said temporary etch stop layer is silicon oxide which is formed by a thermal oxidation with an oxygen ambient at a temperature between about 300° C. and 1000° C. and has a thickness between about 30 and 200 Angstroms.

18. The method of claim 17 wherein a thin oxide layer is formed on the gate electrodes during said thermal oxidation and said thin oxide layer is subsequently removed during removal of the temporary etch stop layer.

19. The method of claim 12 wherein said permanent sidewall spacers are formed by depositing an amorphous silicon layer which is subsequently etched back.

20. The method of claim 19 wherein the substrate having said permanent sidewall spacers is annealed in a $N_2$ ambient to form crystalline silicon sidewall spacers before the implant step.

21. The method of claim 12 wherein step (e) is performed by selectively patterning a photoresist layer to cover the second active region and then implanting the first active region with $BF_2^+$ ions at an energy between about 12 and 17 KeV and a dosage between about $5 \times 10^{15}$ ions/cm$^2$ and $6 \times 10^{15}$ ions/cm$^2$.

22. The method of claim 12 wherein step (f) is performed by selectively patterning a photoresist layer to cover the first active region and then implanting the second active region with $P^{31+}$ ions at an energy between about 10 and 30 KeV and a dosage between about $5 \times 10^{15}$ ions/cm$^2$ and $6 \times 10^{15}$ ions/cm$^2$.

23. The method of claim 12 wherein said rapid thermal anneal step is performed by heating the substrate in a $N_2$ atmosphere at a temperature between about 900° C. and 1100° C. for a period between about 7 and 13 seconds.

24. The method of claim 12 wherein forming a metal silicide layer is comprised of depositing a layer of titanium on said substrate.

25. The method of claim 24 wherein unreacted titanium is removed after the silicidation step by etching with a solution of 1:1:1 $NH_4OH:H_2O_2:H_2O$.

* * * * *